United States Patent
Chen et al.

(10) Patent No.: US 9,590,079 B2
(45) Date of Patent: Mar. 7, 2017

(54) USE DISPOSABLE GATE CAP TO FORM TRANSISTORS, AND SPLIT GATE CHARGE TRAPPING MEMORY CELLS

(71) Applicant: Cypress Semiconductor Corporation, San Jose, CA (US)

(72) Inventors: Chun Chen, San Jose, CA (US); Mark Ramsbey, Sunnyvale, CA (US); Shenqing Fang, Sunnyvale, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/742,201

(22) Filed: Jun. 17, 2015

(65) Prior Publication Data

US 2015/0287812 A1  Oct. 8, 2015

Related U.S. Application Data

(63) Continuation of application No. 13/715,673, filed on Dec. 14, 2012, now abandoned.

(51) Int. Cl.
*H01L 29/792* (2006.01)
*H01L 21/332* (2006.01)
(Continued)

(52) U.S. Cl.
CPC .. *H01L 29/66833* (2013.01); *H01L 21/28282* (2013.01); *H01L 27/1052* (2013.01);
(Continued)

(58) Field of Classification Search
CPC ............. H01L 21/8238; H01L 27/0922; H01L 27/11807; H01L 2027/11807;
(Continued)

(56) References Cited

U.S. PATENT DOCUMENTS

| 5,824,584 A | 10/1998 | Chen et al. |
| 5,969,383 A | 10/1999 | Chang et al. |

(Continued)

FOREIGN PATENT DOCUMENTS

| CN | 101350307 A | 1/2009 |
| KR | 1020050101030 A | 10/2005 |

OTHER PUBLICATIONS

USPTO Advisory Action for U.S. Appl. No. 13/715,673 dated May 6, 2015; 3 pages.
(Continued)

*Primary Examiner* — Julio J Maldonado
*Assistant Examiner* — Moin Rahman

(57) ABSTRACT

A semiconductor device and method of making such device is presented herein. The method includes disposing a gate layer over a dielectric layer on a substrate and further disposing a cap layer over the gate layer. A first transistor gate is defined having an initial thickness substantially equal to a combined thickness of the cap layer and the gate layer. A first doped region is formed in the substrate adjacent to the first transistor gate. The cap layer is subsequently removed and a second transistor gate is defined having a thickness substantially equal to the thickness of the gate layer. Afterwards, a second doped region is formed in the substrate adjacent to the second transistor gate. The first doped region extends deeper in the substrate than the second doped region, and a final thickness of the first transistor gate is substantially equal to the thickness of the second transistor gate.

10 Claims, 12 Drawing Sheets

(51) Int. Cl.
*H01L 29/66* (2006.01)
*H01L 27/115* (2006.01)
*H01L 29/423* (2006.01)
*H01L 21/28* (2006.01)
*H01L 27/105* (2006.01)

(52) U.S. Cl.
CPC .... *H01L 27/1157* (2013.01); *H01L 27/11573* (2013.01); *H01L 29/42344* (2013.01); *H01L 29/792* (2013.01)

(58) Field of Classification Search
CPC ........... H01L 21/76897; H01L 21/8224; H01L 21/8228; H01L 21/8234; H01L 21/823885; H01L 29/0847; H01L 29/42316; H01L 29/42384; H01L 29/66
USPC ......... 257/29, 324, 314–316, 365, 311, 303; 438/136, 137, 156, 173, 192, 206, 212, 438/424, 427, 428, 591
See application file for complete search history.

(56) References Cited

U.S. PATENT DOCUMENTS

| | | | |
|---|---|---|---|
| 6,972,997 | B2 | 12/2005 | Ishimaru et al. |
| 7,057,230 | B2 | 6/2006 | Tanaka et al. |
| 7,115,943 | B2 | 10/2006 | Mine et al. |
| 7,371,631 | B2 | 5/2008 | Sakai et al. |
| 7,414,283 | B2 | 8/2008 | Tanaka et al. |
| 7,504,689 | B2 | 3/2009 | Hisamoto et al. |
| 7,557,005 | B2 | 7/2009 | Ishii et al. |
| 7,635,627 | B2 * | 12/2009 | Cheng ............... H01L 21/28273 257/315 |
| 7,663,176 | B2 | 2/2010 | Sakai et al. |
| 7,667,259 | B2 | 2/2010 | Yasui et al. |
| 7,700,992 | B2 | 4/2010 | Tanaka et al. |
| 7,723,779 | B2 | 5/2010 | Hisamoto et al. |
| 7,863,135 | B2 | 1/2011 | Sakai et al. |
| 7,863,670 | B2 | 1/2011 | Ishii et al. |
| 8,017,986 | B2 | 9/2011 | Tanaka et al. |
| 8,125,012 | B2 | 2/2012 | Mine et al. |
| 2002/0052086 | A1 | 5/2002 | Maeda |
| 2002/0055220 | A1 | 5/2002 | Soderbarg et al. |
| 2007/0145455 | A1* | 6/2007 | Yasui ................... H01L 27/115 257/314 |
| 2007/0262382 | A1 | 11/2007 | Ishii et al. |
| 2008/0290401 | A1* | 11/2008 | Yasui ................. G11C 16/0425 257/324 |
| 2009/0273013 | A1* | 11/2009 | Winstead .......... H01L 27/11526 257/315 |
| 2010/0099246 | A1* | 4/2010 | Herrick .................. B82Y 10/00 438/591 |
| 2010/0105199 | A1 | 4/2010 | Yasui et al. |
| 2011/0095348 | A1 | 4/2011 | Chakihara et al. |
| 2011/0156164 | A1* | 6/2011 | Shirai ............... H01L 21/82341 257/384 |
| 2011/0211396 | A1 | 9/2011 | Takeuchi |
| 2012/0051164 | A1* | 3/2012 | Son ........................ G11C 17/16 365/200 |
| 2012/0068243 | A1 | 3/2012 | Kawashima et al. |

OTHER PUBLICATIONS

USPTO Final Rejection for U.S. Appl. No. 13/715,673 dated Feb. 17, 2015; 18 pages.
USPTO Non-Final Rejection for U.S. Appl. No. 13/715,673 dated Jul. 7, 2014; 15 pages.
USPTO Restriction Requirement for U.S. Appl. No. 13/715,673 dated Feb. 19, 2014; 9 pages.
International Search Report for International Application No. PCT/US2013/074710 dated Apr. 23, 2014; 3 pages.
Ito, F. et al., "A Novel MNOS Technology Using Gate Hole Injection in Erase Operation for Embedded Nonvolatile Memory Applications," 80-81, Symposium on VLSI Technology, Digest of Technical Papers, Renesas Technology Corporation, 2004.
Matsubara, K et al., "Highly Reliable 10ns MONOS Flash," Renesas Technology Europe GmbH, 2008.
Tanaka, T., et al., Hitachi, "A 512kB MONOS type Flash Memory Module Embedded in a Microcontroller," 211-212, Symposium on VLSI Circuits, Digest of Technical Papers, Semiconductor & Integrated Circuits, Hitachi, Ltd., 2003.
Tsuji, Y. et al., "New Degradation Mode of Program Disturb Immunity of Sub-90nm Node Split-Gate SONOS Memory," 699-700, Reliability Physics Symposium, IEEE International, IRPS, Device Platforms Research Laboratories, NEC Corporation, 2008.
Written Opinion of the International Searching Authority for International Application No. PCT/US2013/074710 dated Apr. 23, 2014; 8 pages.
Yanagi, I., et al., "Quantum confinement effect of efficient hole injection in MONOS-type nonvolatile memory-the role pf ultrathin i-Si/P+ poly-Si stacked gate structure fabricated by laser spike annealing," 146-147, Symposium on VLSI Technology, Digest of Technical Papers, Central Research Laboratory, Hitachi Ltd., 2007.

* cited by examiner

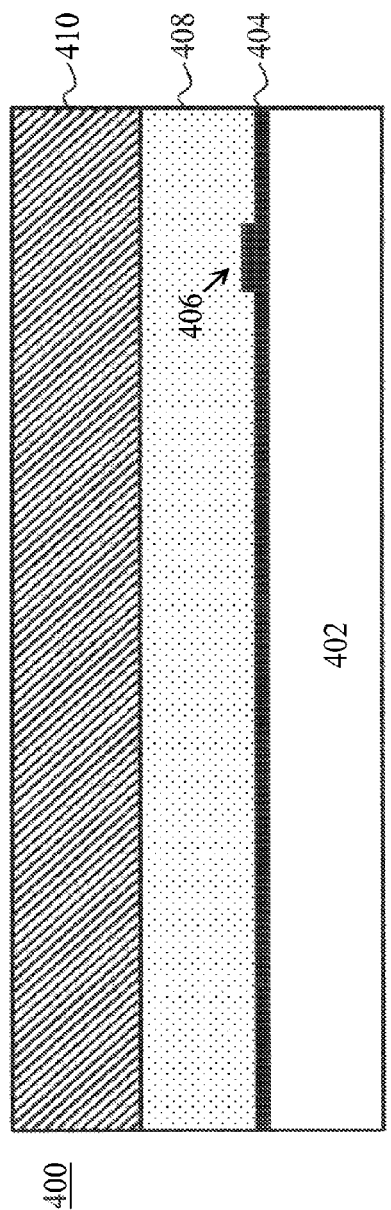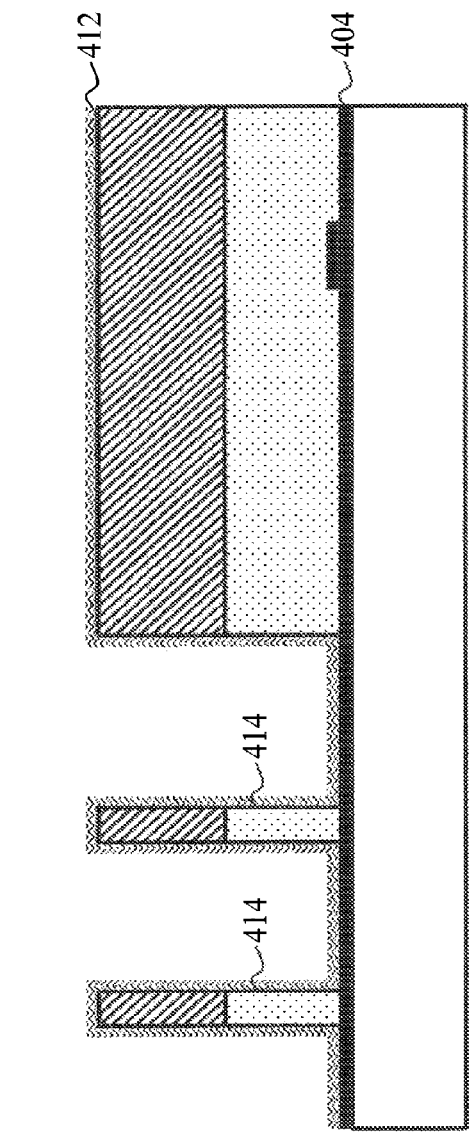
FIG. 4A
FIG. 4B

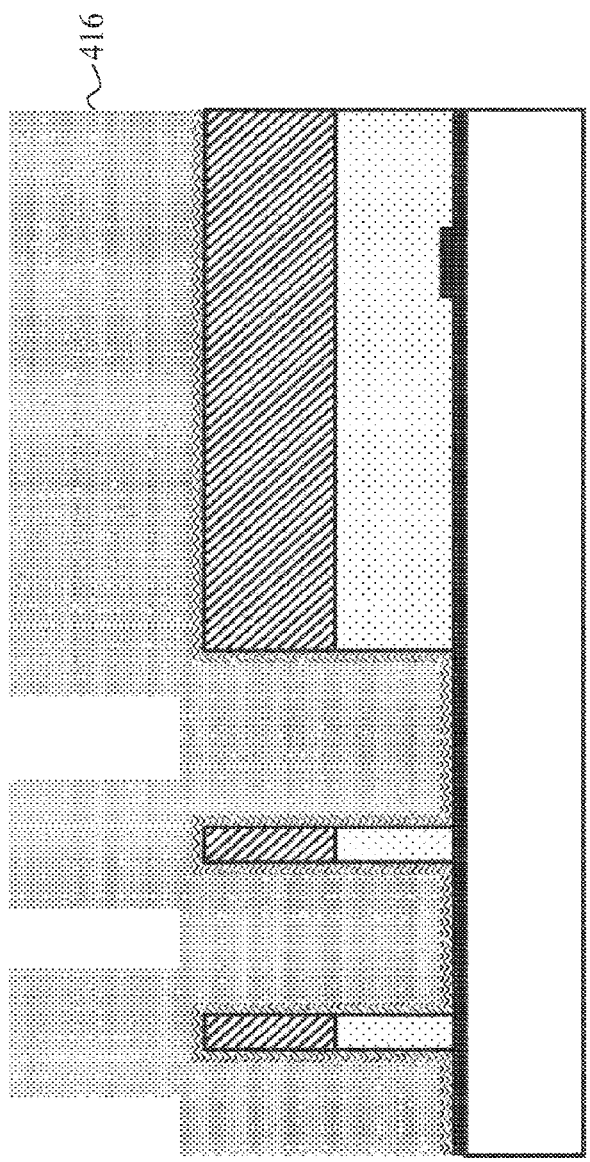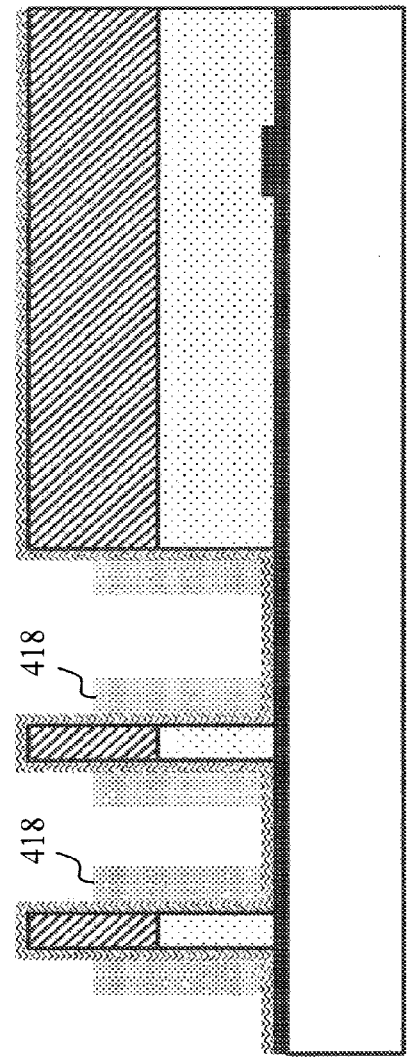
FIG. 4C
FIG. 4D

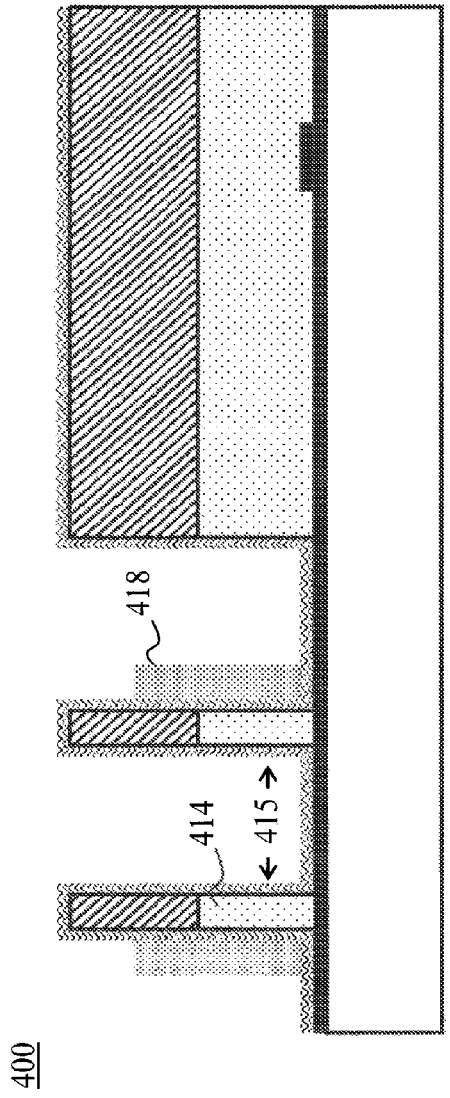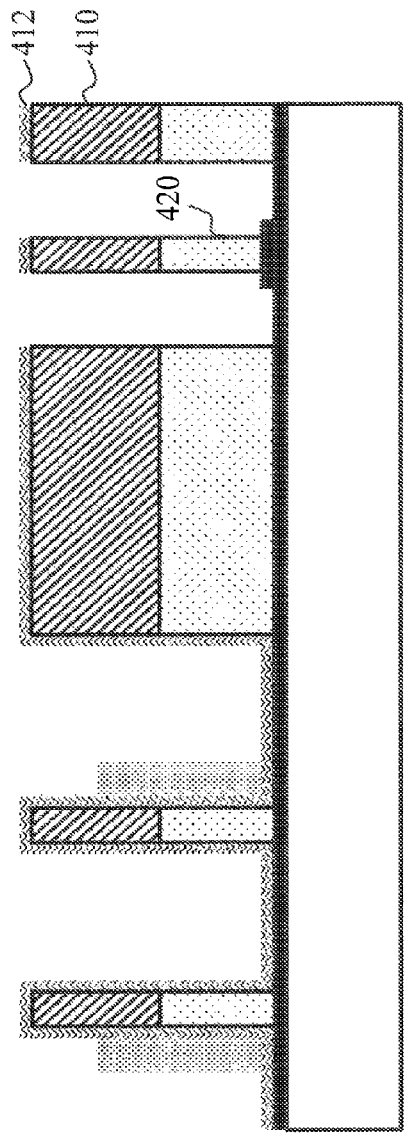
FIG. 4E
FIG. 4F

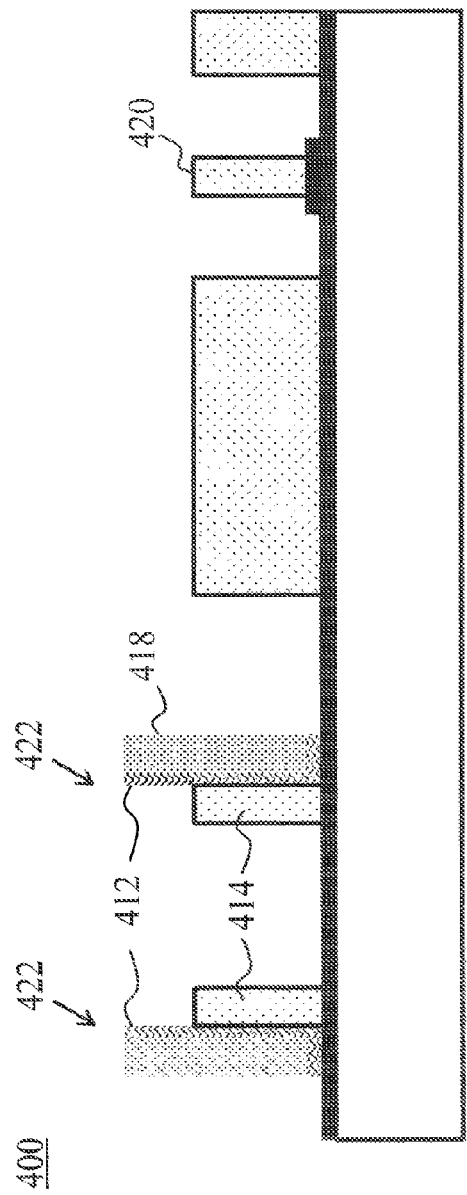
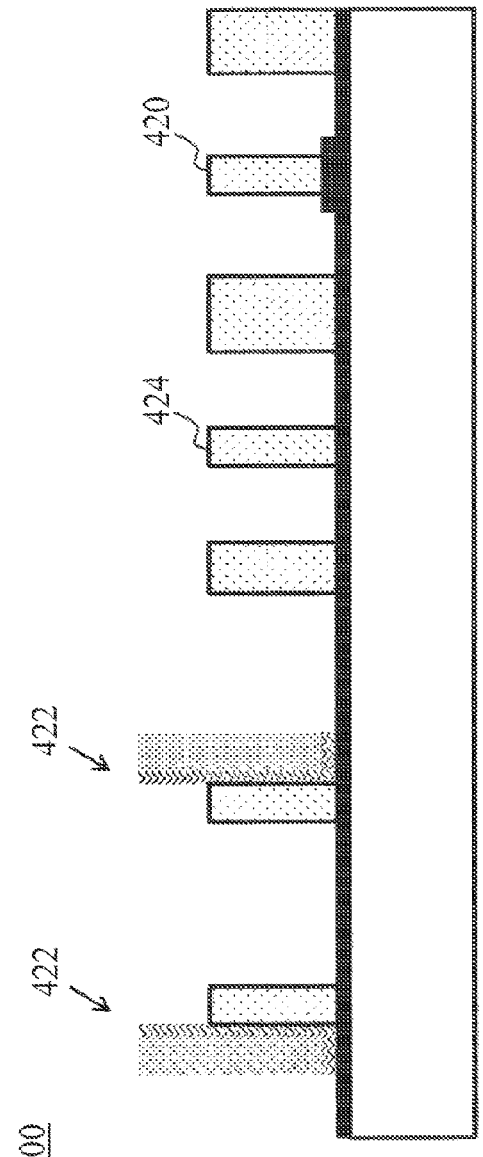
FIG. 4G
FIG. 4H

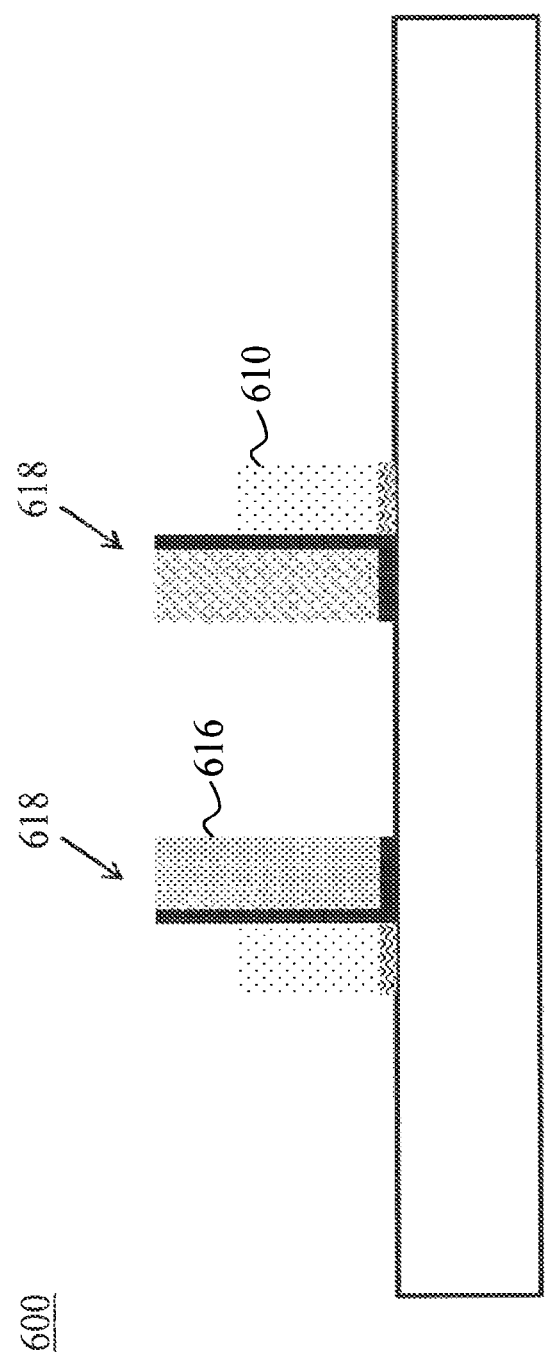

USE DISPOSABLE GATE CAP TO FORM TRANSISTORS, AND SPLIT GATE CHARGE TRAPPING MEMORY CELLS

CROSS-REFERENCE TO RELATED APPLICATIONS

This application is a continuation of U.S. patent application Ser. No. 13/715,673, filed Dec. 14, 2012, all of which is incorporated by reference herein in its entirety.

BACKGROUND

Field

The present application relates to the fabrication of split-gate charge trapping memory cells and other field-effect transistors formed in the same substrate.

Background Art

A non-volatile memory, such as Flash memory, retains stored data even if power to the memory is removed. A non-volatile memory cell stores data, for example, by storing electrical charge in an electrically isolated floating gate or in a charge-trapping layer underlying a control gate of a field-effect transistor (FET). The stored electrical charge controls the threshold of the FET, thereby controlling the memory state of the cell.

A non-volatile memory cell is programmed using, for example, hot carrier injection to place charge into a storage layer. High drain and gate voltages are used to facilitate the programming process, and the memory cell conducts relatively high current during programming, which can be undesirable in low voltage or low power applications.

A split-gate memory cell is a type of non-volatile memory cell, in which a select gate is placed adjacent a memory gate. During programming of a split-gate memory cell, the select gate is biased at a relatively low voltage, and only the memory gate is biased at the high voltage to provide the vertical electric field necessary for hot-carrier injection. Since acceleration of the carriers takes place in the channel region mostly under the select gate, the relatively low voltage on the select gate results in more efficient carrier acceleration in the horizontal direction compared to a conventional Flash memory cell. That makes hot-carrier injection more efficient with lower current and lower power consumption during programming operation. A split-gate memory cell may be programmed using techniques other than hot-carrier injection, and depending on the technique, any advantage over the conventional Flash memory cell during programming operation may vary.

Fast read time is another advantage of a split-gate memory cell. Because the select gate is in series with the memory gate, the erased state of the memory gate can be near or in depletion mode (i.e., threshold voltage, Vt, less than zero volt). Even when the erased memory gate is in such depletion mode, the select gate in the off state prevents the channel from conducting substantial current. With the threshold voltage of the erased state near or below zero, the threshold voltage of the programmed state does not need to be very high while still providing a reasonable read margin between erased and programmed states. Accordingly, the voltages applied to both select gate and memory gate in read operation can be less than or equal to the supply voltage. Therefore, not having to pump the supply voltage to a higher level makes the read operation faster.

It is common to monolithically incorporate multiple types of field-effect devices on the same substrate as the memory cells. Those non-memory devices perform, for example, decoding, charge-pumping, and other functions related to memory operations. The substrate may also include non-memory devices to provide functions that are not related to memory operations. Such non-memory devices incorporated on the same substrate as the memory cells may include transistors tailored for high-speed operations, while other transistors are tailored for handling high operating voltages. Integrating the processing of memory cells, such as a split-gate memory cell, with the processing of one or more types of non-memory transistors on the same substrate is challenging as each requires different fabrication parameters. Accordingly, there is a need for device and methods for integrating different types of devices on the same substrate to facilitate improved cost, performance, reliability, or manufacturability.

SUMMARY

It is desirable to obviate or mitigate at least one of the problems, whether identified herein or elsewhere, or to provide an alternative to existing apparatuses or methods.

According to an embodiment, there is provided an example method for fabricating a semiconductor device. The method includes disposing a gate layer over a dielectric layer on a substrate and further disposing a cap layer over the gate layer. The method then includes etching through the cap layer and the gate layer to define a first transistor gate having an initial thickness substantially equal to a combined thickness of the cap layer and the gate layer. Afterwards, a first doped region is formed in the substrate adjacent to the first transistor gate. The cap layer is subsequently removed and the gate layer is etched again to define a second transistor gate having a thickness substantially equal to the thickness of the gate layer. Afterwards, a second doped region is formed in the substrate adjacent to the second transistor gate. The first doped region extends deeper in the substrate than the second doped region, and a final thickness of the first transistor gate is substantially equal to the thickness of the second transistor gate.

According to another embodiment, there is provided a semiconductor device that includes a first transistor and a second transistor. The first transistor includes a first transistor gate having a first thickness and a first gate length, and a first doped region in the substrate adjacent to the first transistor gate. The second transistor includes a second transistor gate having a second thickness substantially equal to the first thickness and a second gate length less than half the length of the first gate length. The second transistor also includes a second doped region in the substrate adjacent to the second transistor gate, wherein the first doped region extends deeper in the substrate than the second doped region.

According to another embodiment, there is provided an example method for fabricating a semiconductor device. The method includes disposing a gate layer over a first dielectric layer on a substrate and further disposing a cap layer over the gate layer. The method then includes forming a plurality of memory cells in a first region of the substrate. Each of the memory cells includes a select gate disposed over the first dielectric, a memory gate disposed over a second dielectric and adjacent to a sidewall of the select gate, a first doped region in the substrate adjacent to one side of the select gate, and a second doped region in the substrate adjacent to the opposite side of the memory gate. The method further involves etching through the cap layer and the gate layer in a second region of the substrate to define a first transistor gate having an initial thickness substantially equal to a thickness of the cap layer and the gate layer. A third doped region is then formed in the substrate adjacent to the first transistor gate. Next, the cap layer is removed and the gate layer is etched in a third region of the substrate to define a second transistor gate having a thickness substantially equal to the thickness of the gate layer. Afterwards, a fourth doped region is formed in the substrate adjacent to the second transistor gate. The third doped region extends deeper in the substrate than the fourth doped region and a final thickness of the first transistor gate is substantially equal to the thickness of the second transistor gate.

According to another embodiment, there is provided a semiconductor device that includes a plurality of memory cells, a plurality of first transistors, and a plurality of second transistors. The plurality of memory cells are formed in a first region of the substrate and each include a select gate disposed over a first dielectric, a memory gate disposed over a second dielectric and adjacent to a sidewall of the select gate, a first doped region in the substrate adjacent to one side of the select gate, and a second doped region in the substrate adjacent to an opposite side of the memory gate. The plurality of first transistors are formed in a second region of the substrate and each include a first transistor gate having a first thickness and a first gate length, and a third doped region in the substrate adjacent to the first transistor gate. The plurality of second transistors are formed in a third region of the substrate and each include a second transistor gate having a second thickness substantially equal to the first thickness and a second gate length less than half the length of the first gate length. Each of the second transistors also includes a fourth doped region in the substrate adjacent to the second transistor gate, wherein the third doped region extends deeper in the substrate than the fourth doped region.

According to another embodiment, there is provided an example method of fabricating a semiconductor device. The method includes disposing a gate layer over a first dielectric layer on a substrate and further disposing a cap layer over the gate layer. The method then includes forming a plurality of memory cells in a first region of the substrate. Each of the memory cells includes a memory gate disposed over the first dielectric, a select gate disposed over a second dielectric and adjacent to a sidewall of the memory gate, a first doped region in the substrate adjacent to one side of the select gate, and a second doped region in the substrate adjacent to the opposite side of the memory gate. The method further involves etching through the cap layer and the gate layer in a second region of the substrate to define a first transistor gate having an initial thickness substantially equal to a thickness of the cap layer and the gate layer. A third doped region is then formed in the substrate adjacent to the first transistor gate. Next, the cap layer is removed and the gate layer is etched in a third region of the substrate to define a second transistor gate having a thickness substantially equal to the thickness of the gate layer. Afterwards, a fourth doped region is formed in the substrate adjacent to the second transistor gate. The third doped region extends deeper in the substrate than the fourth doped region and a final thickness of the first transistor gate is substantially equal to the thickness of the second transistor gate.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the present invention and to enable a person skilled in the relevant art(s) to make and use the present invention.

FIGS. 4A-4H illustrate various cross-section views of a semiconductor device fabrication process, according to embodiments.

FIGS. 6A-6F illustrate various cross-section views of a semiconductor device fabrication process, according to embodiments.

Figure 1:
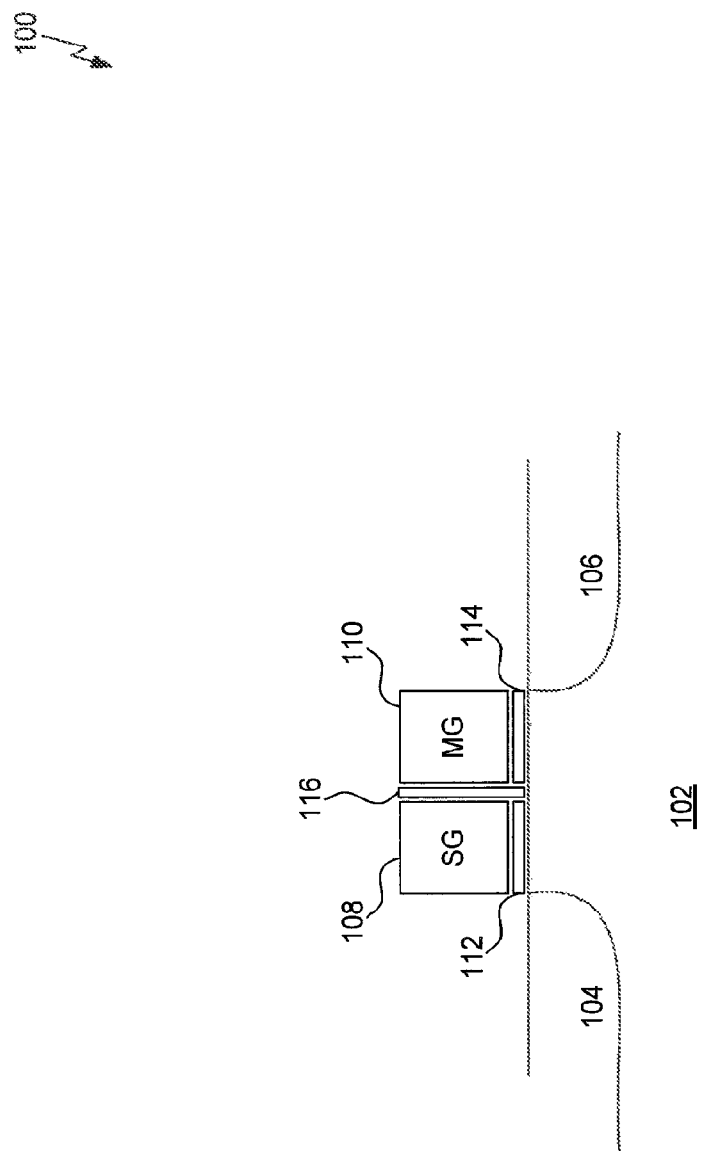
FIG. 1 illustrates a cross-section of a split-gate memory cell, according to various embodiments.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing the various embodiments in more detail, further explanation shall be given regarding certain terms that may be used throughout the descriptions.

The term "etch" or "etching" is used herein to generally describe a fabrication process of patterning a material, such that at least a portion of the material remains after the etch is completed. For example, it should be understood that the process of etching silicon involves the steps of patterning a masking layer (e.g., photoresist or a hard mask) above the silicon, and then removing the areas of silicon no longer protected by the masking layer. As such, the areas of silicon protected by the mask would remain behind after the etch process is complete. However, in another example, etching may also refer to a process that does not use a mask, but still leaves behind at least a portion of the material after the etch process is complete.

The above description serves to distinguish the term "etching" from "removing." When etching a material, at least a portion of the material remains behind after the process is completed. In contrast, when removing a material, substantially all of the material is removed in the process. However, in some embodiments, 'removing' is considered to be a broad term that may incorporate etching.

During the descriptions herein, various regions of the substrate upon which the field-effect devices are fabricated are mentioned. It should be understood that these regions may exist anywhere on the substrate and furthermore that the regions may not be mutually exclusive. That is, in some embodiments, portions of one or more regions may overlap. Although up to three different regions are described herein, it should be understood that any number of regions may exist on the substrate and may designate areas having certain types of devices or materials. In general, the regions are used to conveniently describe areas of the substrate that include similar devices and should not limit the scope or spirit of the described embodiments.

The terms "deposit" or "dispose" are used herein to describe the act of applying a layer of material to the substrate. Such terms are meant to describe any possible layer-forming technique including, but not limited to, thermal growth, sputtering, evaporation, chemical vapor deposition, epitaxial growth, electroplating, etc.

The "substrate" as used throughout the descriptions is most commonly thought to be silicon. However, the substrate may also be any of a wide array of semiconductor materials such as germanium, gallium arsenide, indium phosphide, etc. In other embodiments, the substrate may be electrically non-conductive such as a glass or sapphire wafer.

Before describing such embodiments in more detail, it is instructive to present an example memory cell and environment in which the present embodiments may be implemented.

FIG. 1 illustrates an example of a split-gate non-volatile memory cell 100. Memory cell 100 is formed on a substrate 102, such as silicon. Substrate 102 is commonly p-type or a p-type well while a first doped source/drain region 104 and a second doped source/drain region 106 are n-type. However, it is also possible for substrate 102 to be n-type while regions 104 and 106 are p-type.

Memory cell 100 includes two gates, a select gate 108 and a memory gate 110. Each gate may be a doped polysilicon layer formed by well known, for example, deposit and etch techniques to define the gate structure. Select gate 108 is disposed over a dielectric layer 112. Memory gate 110 is disposed over a charge trapping dielectric 114 having one or more dielectric layers. In one example, charge trapping dielectric 114 includes a charge trapping silicon nitride layer sandwiched between two silicon dioxide layers to create a three-layer stack collectively and commonly referred to as "ONO." Other charge trapping dielectrics may include a silicon-rich nitride film, or any film that includes, but is not limited to, silicon, oxygen, and nitrogen in various stoichiometries. A vertical dielectric 116 is also disposed between select gate 108 and memory gate 110 for electrical isolation between the two gates. In some examples, vertical dielectric 116 and charge trapping dielectric 114 are the same dielectric, while other examples form one dielectric before the other (e.g., they can have different dielectric properties.) As such, vertical dielectric 116 need not include the same film structure as charge trapping dielectric 114. Regions 104 and 106 are created by implanting dopants using, for example, an ion implantation technique. Regions 104 and 106 form the source or drain of the split-gate transistor depending on what potentials are applied to each. In split gate transistors, for convenience, region 104 is commonly referred to as the drain, while region 106 is commonly referred to as the source, independent of the relative biases. It is to be understood that this description is meant to provide a general overview of a common split-gate architecture and that, in actual practice, many more detailed steps and layers are provided to form the final memory cell 100.

An example write, read, and erase operation will now be described as it relates to memory cell 100. In order to write a bit in memory cell 100, a positive voltage on the order of 5 volts, for example, is applied to region 106 while region 104 and substrate 102 are grounded. A low positive voltage on the order of 1.5 volts, for example, is applied to select gate 108 while a higher positive voltage on the order of 8 volts, for example, is applied to memory gate 110. As electrons are accelerated within a channel region between the source and drain, some of them will acquire sufficient energy to be injected upwards and get trapped inside charge trapping dielectric 114. This is known as hot electron injection. In one example of charge trapping dielectric 114, the electrons are trapped within a nitride layer of charge trapping dielectric 114. This nitride layer is also commonly referred to as the charge trapping layer. The trapped charge within charge trapping dielectric 114 store the "high" bit within memory cell 100, even after the various supply voltages are removed.

In order to "erase" the stored charge within memory cell 100 and return the state of memory cell 100 to a "low" bit, a positive voltage on the order of 5 volts, for example, is applied to region 106 while region 104 is floated or at a certain bias, and select gate 108 and substrate 102 are typically grounded. A high negative voltage on the order of −8 volts, for example, is applied to memory gate 110. The bias conditions between memory gate 110 and region 106 generate holes through band-to-band tunneling. The generated holes are sufficiently energized by the strong electric field under memory gate 110 and are injected upwards into charge trapping dielectric 114. The injected holes effectively erase the memory cell 100 to the "low" bit state.

In order to "read" the stored bit of memory cell 100, a low voltage is applied to each of the select gate, memory gate, and region 104 in the range between zero and 3 volts, for example, while region 106 and substrate 102 are typically grounded. The low voltage applied to the memory gate is chosen so that it lies substantially equidistant between the threshold voltage necessary to turn on the transistor when storing a "high" bit and the threshold voltage necessary to turn on the transistor when storing a "low" bit in order to clearly distinguish between the two states. For example, if the application of the low voltage during the "read" operation caused substantial current to flow between regions 104 and 106, then the memory cell holds a "low" bit and if the application of the low voltage during the "read" operation does not cause substantial current to flow between regions 104 and 106, then the memory cell holds a "high" bit.

Figure 2:
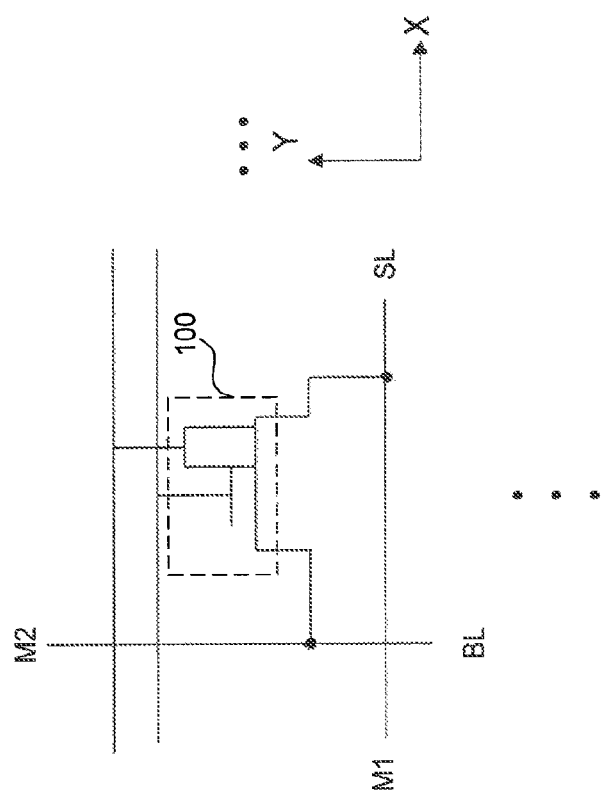
FIG. 2 illustrates connections made to a split-gate memory cell, according to various embodiments.

FIG. 2 illustrates an example circuit diagram 200 of memory cell 100 including connections to various metal layers in a semiconductor device. Only a single memory cell 100 is illustrated, however, as evidenced by the ellipses in both the X and Y direction, an array of memory cells may be connected by the various lines running in both the X and Y directions. In this way, one or more memory cells 100 may be selected for reading, writing, and erasing bits based on the bit line (BL) and source line (SL) used.

An example source line (SL) runs along the X direction and is formed in a first metal layer (M1). Source line (SL) may be used to make electrical connection with doped region 106 of each memory cell 100 along a row extending in the X direction.

An example bit line (BL) runs along the Y direction and is formed in a second metal layer (M2). Bit line (BL) may be used to make electrical connection with doped region 104 of each memory cell 100 along a column extending in the Y direction.

It is to be understood that the circuit connections shown in FIG. 2 are only exemplary and that the various connections could be made in different metal layers than those illustrated. Furthermore, although not depicted, memory cells 100 may be arrayed in the Z direction as well formed within multiple stacked layers.

Figure 3:
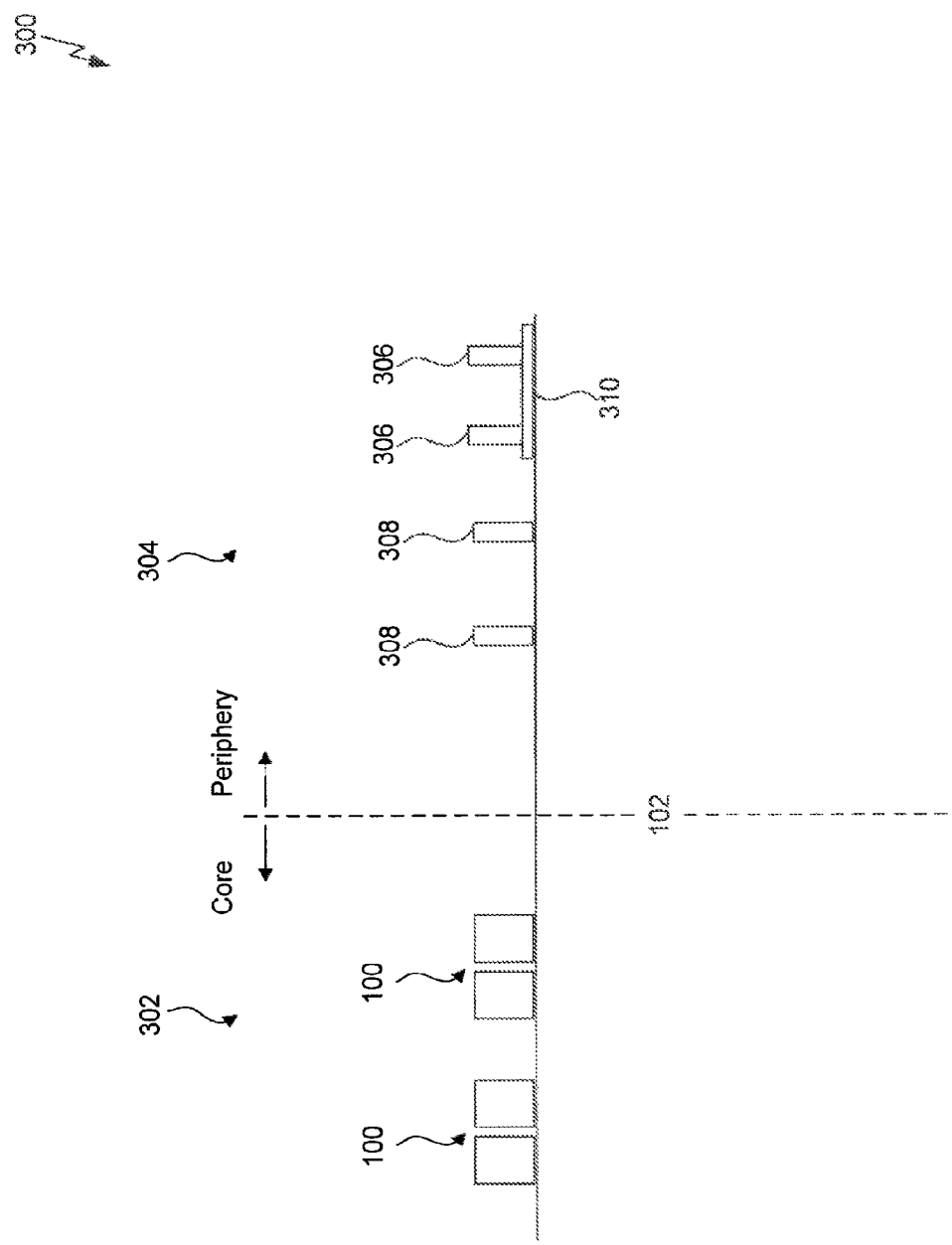
FIG. 3 illustrates field-effect devices formed in various regions of a substrate, according to various embodiments.

FIG. 3 illustrates an example semiconductor device 300 that includes both memory and peripheral circuitry in the same substrate. In this example, substrate 102 includes a core region 302 and a periphery region 304. Core region 302 includes a plurality of memory cells 100 that may operate similarly to those previously described. It should be understood that the cross-section of FIG. 3 is only exemplary, and that core region 302 and periphery region 304 may be located in any area of substrate 102 and may be made up of various different regions. Furthermore, core region 302 and periphery region 304 may exist in the same general area of substrate 102.

Periphery region 304 may include integrated circuit components such as resistors, capacitors, inductors, etc., as well as transistors. In the illustrated embodiment, periphery region 304 includes a plurality of high-voltage transistors 306 and low-voltage transistors 308. In one example, high-voltage transistors 306 exist in a separate region of substrate 102 than low-voltage transistors 308. High-voltage transistors 306 are capable of handling, voltages up to 20 volts in magnitude, for example, while low-voltage transistors 308 operate at a faster speed, but cannot operate at the same high voltages as high-voltage transistors 306. In an embodiment, low voltage transistors 308 are designed to have a shorter gate length than high voltage transistors 306. High-voltage transistors 306 are commonly characterized as having a thicker gate dielectric 310 than the gate dielectric of low-voltage transistors 308.

FIGS. 4A-4H illustrate a fabrication process flow for a semiconductor device including memory cells and other field-effect devices, according to an embodiment. It should be understood that the various layers are not necessarily drawn to scale and that other processing steps may be performed as well between the steps illustrated as would be understood by one skilled in the art given the description herein.

FIG. 4A illustrates a cross-section of a semiconductor device 400 that includes a substrate 402 having a dielectric layer 404 disposed on top, according to an embodiment. In one example, dielectric layer 404 includes a thicker region 406. Thicker region 406 may be used as a gate dielectric for transistors that operate at high voltage magnitudes. Also disposed over dielectric layer 404 is a first gate layer 408 followed by a cap layer 410.

In an embodiment, gate layer 408 is a polycrystalline silicon ("poly") layer. In other examples, gate layer 408 may be any electrically conductive material such as various metals or metal alloys. Cap layer 410, likewise, may include any number of different materials or layers such as silicon dioxide or silicon nitride. It is preferable, though not required, that cap layer 410 be a material that may be selectively removed.

FIG. 4B illustrates another cross-section of semiconductor device 400 after performing an etching process followed by a deposition of a second dielectric layer 412, according to an embodiment. The etching process is performed through both cap layer 410 and gate layer 408 down to first dielectric 404. The etching may use a dry technique such as, for example, reactive ion etching (RIE) or the etching may use a wet technique such as, for example, hot acid baths.

The etching is performed to define a select gate 414, according to an embodiment. In this example, select gate 414 may eventually be used as the select gate for a memory cell as described above with reference to FIG. 1. As such, the etched area illustrated in FIG. 4B may be in a memory cell region (e.g., core region) on substrate 402. The select gates for two memory cells are illustrated in this example, not intended to be limiting.

After the etch has been performed, second dielectric layer 412 is deposited over substrate 402 in at least the memory cell region where select gate 414 is formed. In an embodiment, second dielectric layer 412 acts as a charge trapping dielectric and includes a specific charge trapping layer. There are many possible layering structures for the charge trapping dielectric. In one common example, the charge trapping dielectric is formed by disposing a layer of silicon oxide, followed by a deposition of silicon nitride, followed again by a deposition of silicon oxide. This procedure creates what is commonly referred to as an "ONO" stack where the silicon nitride layer sandwiched between the two oxide layers acts as the charge trapping layer. This charge trapping layer will exist beneath the memory gate and trap charge to set the memory bit as either a '0' or '1.'

It should be noted that second dielectric layer 412 is shown as being deposited over first dielectric layer 404 in areas between select gates 414. However, in another embodiment, first dielectric layer 404 may first be etched away in the exposed areas between select gates 414 before second dielectric layer 412 is deposited. Such a procedure may form a better quality charge trapping dielectric beneath the memory gate.

FIG. 4C illustrates another cross-section of semiconductor device 400 after disposing a second gate layer 416 across at least the memory cell region where select gate 414 is formed. In one embodiment, second gate layer 416 is a polysilicon layer.

FIG. 4D illustrates the formation of a plurality of memory gates 418, according to an embodiment. Memory gates 418 may be formed via an "etch-back" process, in which a blanket etch is performed across the substrate on second gate layer 416. This etch will remove second gate layer 416 in all areas except those adjacent to the previously defined select gates 414. As such, memory gates 418 are self-aligned directly adjacent to both sidewalls of each select gate 414, and are also formed directly over second dielectric layer 412. It should also be noted that in this example, memory gates 418 are taller (e.g., thicker) than select gates 414. This is due to the existence of cap layer 410 over select gates 414 while forming memory gates 418.

FIG. 4E illustrates another cross-section of semiconductor device 400 where some of the previously patterned memory gates 418 are removed. Each memory cell only requires a single select gate and a single memory gate, according to an embodiment. The removal of the unnecessary gates (e.g., as illustrated at arrows 415) frees up space on substrate 402 in the memory cell region and also allows for a doped region to be implanted into substrate 402 aligned adjacent to select gate 414.

Although not indicated in the figure, the source and drain doped regions are formed in the substrate for each memory cell, according to an embodiment. As mentioned earlier, the drain region is formed adjacent to select gate 414 in substrate 402, while the source region is formed adjacent to memory gate 418 in substrate 402. In one embodiment, the two memory cells illustrated may share the same drain region between the two select gates 414.

FIG. 4F illustrates another cross-section of semiconductor device 400, according to an embodiment. A first transistor gate 420 is patterned via an etching process that may be similar to the previous etching process used to define select gates 414. First transistor gate 420 is patterned over thicker region 406 of first dielectric 404. In one embodiment, first transistor gate 420 is the gate for a high-voltage transistor designed to handle high magnitude voltages. Such voltage magnitudes may be up to 20 volts. First transistor gate 420 may be formed in a region on substrate 402 that includes other high-voltage rated devices. It should be understood that the single illustrated first transistor gate 420 may represent any number of patterned transistor gates over thicker region 406 of first dielectric 404.

Although second dielectric layer 412 is shown above cap layer 410 in the region where first transistor gate 420 is patterned, it is not required for this patterning step. In another embodiment, second dielectric layer 412 is removed throughout the periphery region of substrate 402 before any of the various transistor gates are formed in the periphery region.

After first transistor gate 420 has been patterned, the source and drain doped regions (not shown) are formed adjacent to each side of first transistor gate in substrate 402, according to an embodiment. The junction depth of each doped region may be deep to accommodate the high magnitude voltages associated with the field-effect device having first transistor gate 420. According to an embodiment, the high ionization energy of the dopants to be implanted in substrate 402 is not sufficient to penetrate both the thickness of cap layer 410 and gate layer 408. If cap layer 410 was not present during, the implantation process, than the dopants may have been able to penetrate through first transistor gate 420, effectively shorting the transistor.

FIG. 4G illustrates another cross-section of semiconductor device 400 where cap layer 410 has been removed, according to an embodiment. Optionally, second dielectric layer 412 has also been removed in all areas except between memory gate 418 and substrate 402 and between memory gate 418 and select gate 414. After the removal of cap layer 410, the thickness of first transistor gate is substantially the same as the thickness of gate layer 408. The field-effect device having first transistor gate 420 may be formed in a region on substrate 402 separate from the memory cell region where a plurality of memory cells 422 are formed.

FIG. 4H illustrates another cross-section of semiconductor device 400 where a second transistor gate 424 has been patterned, according to an embodiment. Gate layer 408 is etched to define one or more second transistor gates 424 in a region on substrate 402 that may be separate from the memory cell region where the plurality of split-gate memory cells 422 are formed. In an embodiment, second transistor gate is formed over first dielectric layer 404, and thus has a thinner gate dielectric than that associated with first transistor gate 420. In one example, second transistor gate 424 is patterned in a different region on substrate 402 than first transistor gate 420. It should be understood that the single illustrated second transistor gate 424 may represent any number of similarly patterned transistor gates in the same region on substrate 402.

After second transistor gate 424 has been patterned, the source and drain doped regions are formed adjacent to each side of second transistor gate in substrate 402. According to an embodiment, the doped regions associated with second transistor gate 424 are shallower in substrate 402 than those associated with first transistor gate 420. After second transistor gate 424 has been formed, the thickness of second transistor gate 424 is substantially similar to the thickness of first transistor gate 420.

At this stage, the various field-effect devices have been formed across different regions of substrate 402. As an optional final step, a layer of silicide may be disposed over the various gates and doped areas to increase the conductivity and reduce parasitic effects such as, for example, RC delay times for each connection. It should be understood that the order and details of each of the fabrication steps illustrated is only exemplary. Some of the processes may be performed in a different order or can be combined to create semiconductor device 400 without deviating from the scope or spirit of the invention. For example, the same etch process may be used to define select gate 414 and first transistor gate 420. Other examples may include forming the field effect devices in the periphery region first (including first transistor gate 420 and second transistor gate 424) while forming split-gate memory cells 422 in the memory cell region afterwards. Other similar alterations or deviations may be contemplated by one having skill in the relevant art(s) given the description herein.

Figure 5:
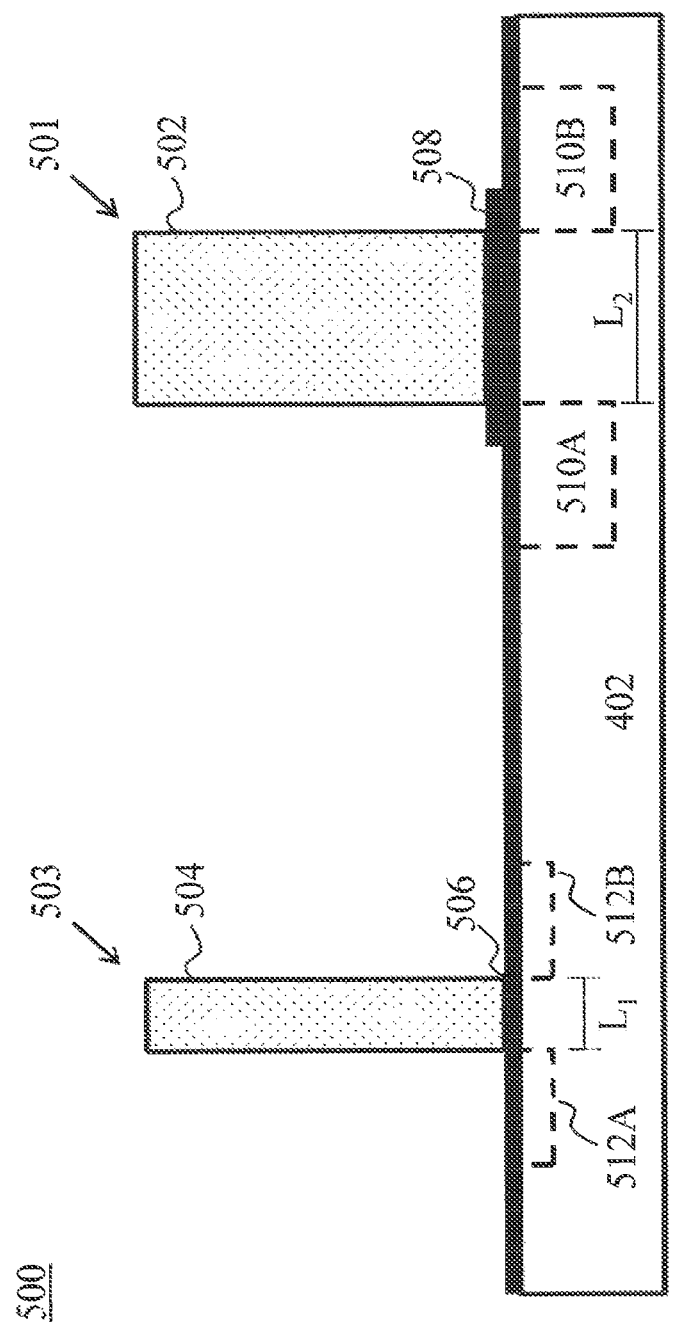
FIG. 5 illustrates a cross-section view of field-effect devices having different characteristics, according to an embodiment.

FIG. 5 illustrates an example cross-section of a semiconductor device 500 having a first transistor 501 and a second transistor 503. In an embodiment, semiconductor device 500 is formed using a substantially similar process as that previous described for forming the periphery transistors of semiconductor device 400. First transistor 501 includes a first gate 502 patterned over a thick dielectric layer 508 and also includes doped source/drain regions 510A and 510B. Second transistor 503 includes a second gate 504 patterned over a thin dielectric layer 506 and also includes doped source/drain regions 512A and 512B.

In an embodiment, first transistor 501 is a high-voltage transistor capable of handling voltages with magnitudes up to 20 volts. The thicker gate dielectric protects first transistor 501 from dielectric break-down when applying the high voltage magnitudes. Furthermore, doped regions 510A and 510B are implanted deep into substrate 402 to accommodate the larger depletion regions and electric fields that are generated.

In an embodiment, second transistor 503 is a low-voltage transistor designed for fast switching speeds and capable of handling lower voltage magnitudes up to about 5 volts. Having a short gate length (L1) decreases the switching speed of second transistor 503. In an embodiment, the gate length (L1) of second transistor 503 is less than or equal to half the gate length (L2) of first transistor 501. In one such example, L1 is 45 nm while L2 is at least 90 nm. In another example, L1 is between 10-40 nm. The junction depths of doped regions 510A and 510B are also deeper than the junction depths of 512A and 512B, according to an embodiment. However, even with the difference in gate lengths and junctions depths between first transistor 501 and second transistor 503, the thickness of first gate 502 is substantially equal to the thickness of second gate 504. Any discrepancy caused by the extra thickness afforded due to thicker dielectric layer 508 is considered negligible.

The fabrication process flow illustrated in FIGS. 4A-4H demonstrate an example where the various split-gate memory cells are formed with the select gate being defined first, followed by the memory gate self-aligned to a sidewall of the select gate. Such a process ultimately results in the memory gate being thicker than the select gate as shown in FIG. 4H, according to one embodiment. However, the invention is not limited to forming the select gate before the memory gate, and in another embodiment, the memory gate is formed first followed by a self-aligned select gate. An example process flow for forming the memory gate first is illustrated in FIGS. 6A-6F. Note that FIGS. 6A-6F only illustrate cross-sections of the memory cell region and thus do not illustrate the formation of the various transistors in the other (e.g., periphery) regions.

Figure 6A:
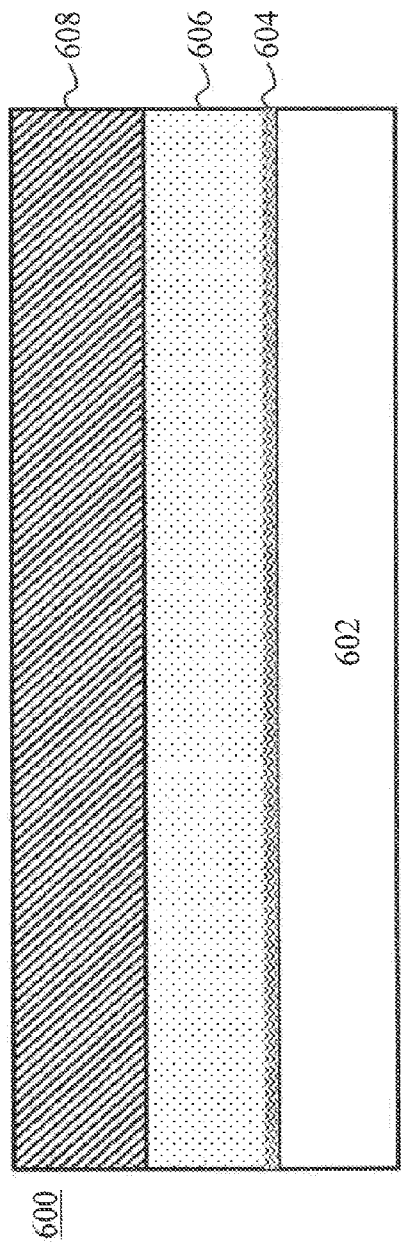

FIG. 6A illustrates a cross-section of a semiconductor device 600 that includes a substrate 602 having a charge trapping dielectric 604 disposed on top, according to an embodiment. Also disposed over charge trapping dielectric 604 is a gate layer 606 followed by a cap layer 608. Cap layer 608 and first gate layer 606 may be substantially similar to gate layer 408 and cap layer 410 as described previously with reference to FIGS. 4A-4H.

Charge trapping dielectric 604 may be similar to the previously described second dielectric layer 412. As such, charge trapping dielectric 604 may be a "ONO" stack according to one embodiment.

Figure 6B:
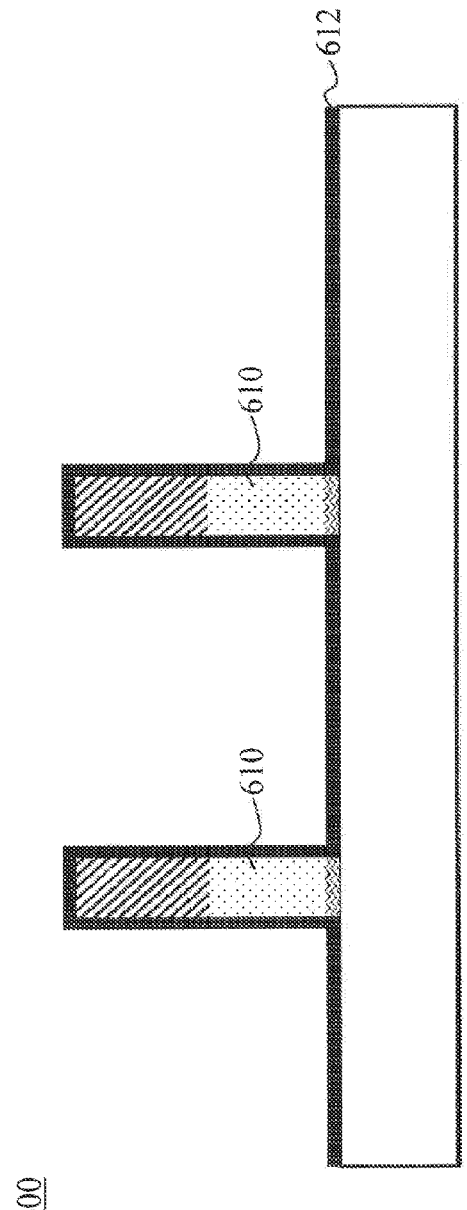

FIG. 6B illustrates another cross-section of semiconductor device 600 where a plurality of memory gates 610 have been formed, according to an embodiment. Memory gates 610 are defined in a similar manner as previously described for creating select gates 414.

Charge trapping dielectric 604 has been etched such that portions exist only beneath memory gates 610. Afterwards, a second dielectric layer 612 is disposed over substrate 602. Second dielectric layer 612 may be silicon dioxide, and also covers the sidewalls of memory gates 410 during the deposition process.

Figure 6C:
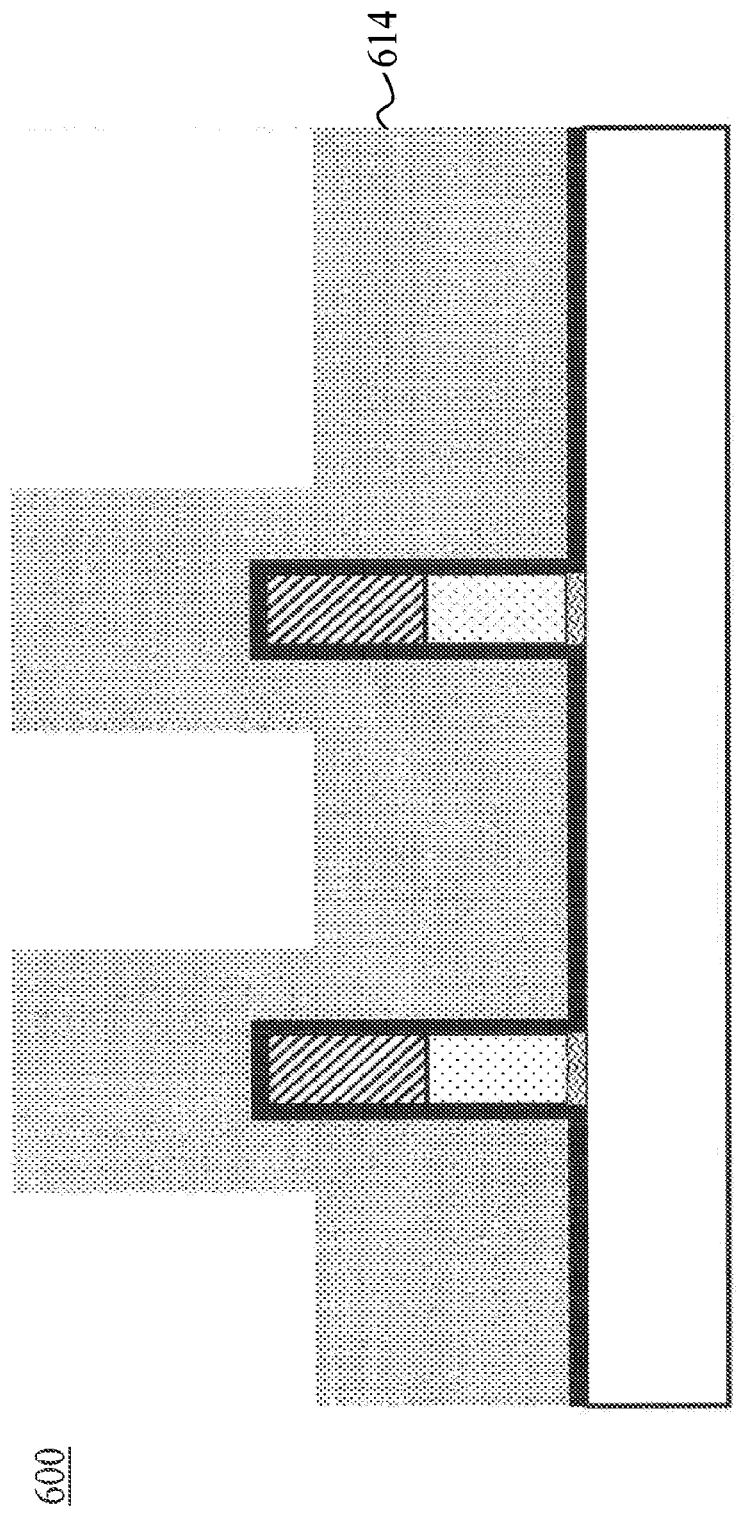

FIG. 6C illustrates another cross-section of semiconductor device 600 where a second gate layer 614 has been disposed. In one embodiment, second gate layer 614 is a polysilicon layer.

Figure 6D:
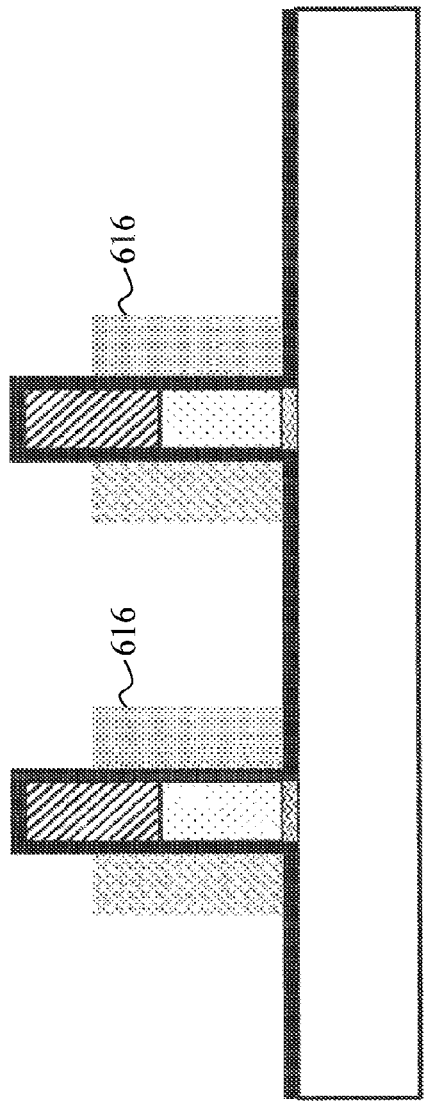

FIG. 6D illustrates another cross-section of semiconductor device 600 where a plurality of select gates 616 are formed adjacent to both sidewalls of each memory gate 610. Select gates 616 may be formed using a similar "etch-back" process as described previously for forming memory gates 418 with reference to FIG. 4D. It should also be noted that in this example, select gates 616 are taller (e.g., thicker) than memory gates 610. This is due to the existence of cap layer 608 over memory gates 610 while forming select gates 616.

Figure 6E:
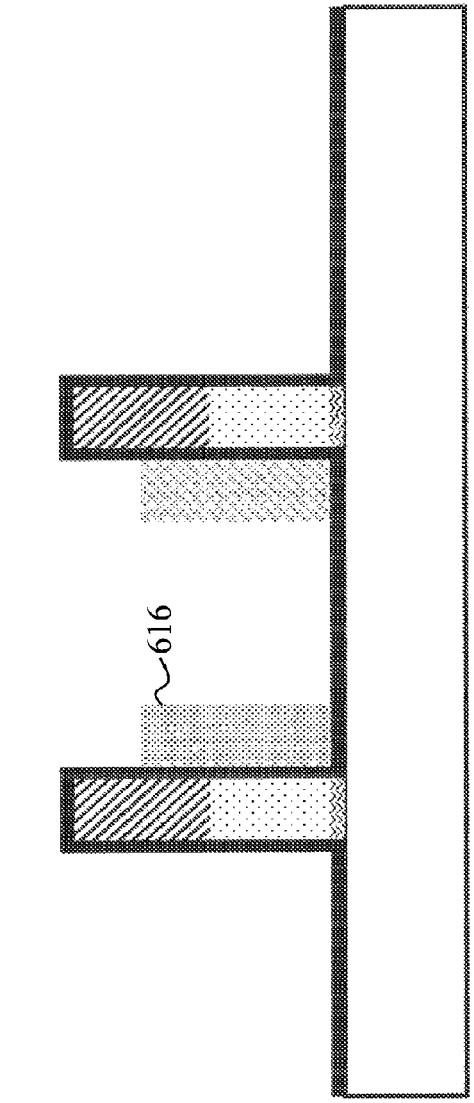

FIG. 6E illustrates another cross-section of semiconductor device 600 where some of the previously patterned select gates 616 are removed. Each memory cell only requires a single select gate and a single memory gate, according to an embodiment. The removal of the unnecessary gates frees up space on substrate 602 in the memory cell region and also allows for a doped region to be implanted into substrate 602 aligned adjacent to each memory gate 610.

FIG. 6F illustrates another cross-section of semiconductor device 600 where cap layer 608 has been removed and the formation of a plurality of split-cell memory cells 618 is nearly complete, according to an embodiment. Optionally, second dielectric layer 612 has been etched away in all areas except under select gates 616 and between select gates 616 and memory gates 610.

Although not indicated in the figure, after the final patterning of select gates 616 and/or removal of cap layer 608, the source and drain doped regions are formed in the substrate for each split-gate memory cell, according to an embodiment. As mentioned earlier, the drain region is formed adjacent to select gates 616 in substrate 602 while the source region is formed adjacent to memory gates 610 in substrate 602. In one embodiment, the two memory cells illustrated may share the same drain region between two select gates 616.

Once split-gate memory cells 618 have been fully formed up through FIG. 6E, other transistors may be formed in the periphery region in a similar manner as described earlier with reference to FIGS. 4F-4H. Also, similar to the process flow illustrated for semiconductor device 400, the steps illustrated in FIGS. 6A-6F is only one example for forming semiconductor device 600. The steps may be performed in a different order or may be combined in some aspects to generate a substantially similar final structure. Such modifications would be apparent to one having skill in the relevant art(s) given the description herein.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified sanctions and relationships thereof. The boundaries of these functional building blocks have been arbitrarily defined herein for the convenience of the description. Alternate boundaries can be defined so long as the specified functions and relationships thereof are appropriately performed.

The breadth and scope of the present invention should not be limited by any of the above-described exemplary embodiments, but should be defined only in accordance with the following claims and their equivalents.

What is claimed is:

1. A method of fabricating a semiconductor device having a first, second, and third region on a substrate, comprising:
   disposing a first gate layer over a first dielectric on the substrate;
   disposing a cap layer over the first gate layer;
   forming a plurality of memory cells in the first region, comprising,
      etching through the cap layer and the first gate layer in the first region to define at least one select gate disposed over the first dielectric,
      disposing a second dielectric over the at least one select gate and the substrate in at least the first region,
      disposing a second gate layer over the second dielectric,
      etching the second gate layer to define at least one memory gate disposed over the second dielectric, each of the at least one memory gates adjacent to a corresponding sidewall of one of the at least one select gates, and
      forming a first doped region in the substrate adjacent to one side of the at least one select gate and a second doped region in the substrate adjacent to an opposite side of the memory gate adjacent to the at least one select gate;

etching through the cap layer and the first gate layer in the second region to define a first transistor gate having an initial thickness substantially equal to a thickness of the cap layer and the first gate layer;

forming a third doped region in the substrate adjacent to the first transistor gate;

removing the cap layer;

etching through the first gate layer in the third region to define a second transistor gate having a thickness substantially equal to the thickness of the first gate layer; and forming a fourth doped region in the substrate adjacent to the second transistor gate, wherein the third doped region extends deeper in the substrate than the fourth doped region, and wherein a final thickness of the first transistor gate is substantially equal to the thickness of the second transistor gate.

2. The method of claim 1, wherein disposing the second dielectric comprises disposing one or more dielectric layers by sequentially disposing oxide, nitride, and oxide (ONO) layers.

3. The method of claim 1, wherein etching the second gate layer comprises performing an etch-back process to define the memory gate that is self-aligned adjacent to the sidewall of the select gate.

4. The method of claim 1, further comprising forming the first dielectric on the substrate before disposing the first gate layer, wherein the first dielectric has a first thickness in the second region associated with the first transistor gate and a second thickness in the third region associated with the second transistor gate.

5. The method of claim 1, wherein disposing a cap layer comprises disposing a silicon nitride layer.

6. The method of claim 1, wherein disposing a cap layer comprises disposing one or more layers of silicon nitride or silicon dioxide.

7. The method of claim 1, further comprising forming silicide over at least a top surface of the first transistor gate, the second transistor gate, the at least one select gate, and the at least one memory gate.

8. A method of fabricating a semiconductor device having a first, second, and third region on a substrate, comprising:
disposing a first dielectric on the substrate;
disposing a first gate layer over the first dielectric;
disposing a cap layer over the first gate layer;
forming a plurality of memory cells in the first region, comprising:
etching through the cap layer and the first gate layer in the first region to define at least one select gate disposed over the first dielectric,
disposing a second dielectric over the at least one select gate and the substrate in at least the first region,
disposing a second gate layer over the second dielectric,
etching the second gate layer to define at least one memory gate disposed over the second dielectric, each of the at least one memory gates adjacent to a corresponding sidewall of one of the at least one select gates, and
forming a first doped region in the substrate adjacent to one side of the at least one select gate and a second doped region in the substrate adjacent to an opposite side of the memory gate adjacent to the at least one select gate;

etching through the cap layer and the first gate layer in the second region to define a first transistor gate having an initial thickness substantially equal to a thickness of the cap layer and the first gate layer;

forming a third doped region in the substrate adjacent to the first transistor gate;

removing the cap layer;

etching through the first gate layer in the third region to define a second transistor gate having a thickness substantially equal to the thickness of the first gate layer; and forming a fourth doped region in the substrate adjacent to the second transistor gate, wherein the third doped region extends deeper in the substrate than the fourth doped region, and wherein a final thickness of the first transistor gate is substantially equal to the thickness of the second transistor gate.

9. The method of claim 8, wherein disposing the first dielectric comprises sequentially disposing oxide, nitride, and oxide (ONO) layers.

10. The method of claim 8, wherein etching the second gate layer comprises performing an etch-back process to define the select gate that is self-aligned adjacent to the sidewall of the memory gate.

* * * * *